United States Patent [19]

Schwehr et al.

[11] Patent Number: 4,935,845
[45] Date of Patent: Jun. 19, 1990

[54] ELECTRONIC CIRCUIT MODULE WITH IMPROVED COOLING

[75] Inventors: Gregory D. Schwehr, Milwaukee; Richard E. Zibolski, Menomonee Falls, both of Wis.

[73] Assignee: General Electric Company, Milwaukee, Wis.

[21] Appl. No.: 217,249

[22] Filed: Jul. 11, 1988

[51] Int. Cl.⁵ .............................................. H05K 7/20
[52] U.S. Cl. ................................................... 361/384
[58] Field of Search .............. 361/383, 384, 391, 392, 361/393, 395

[56] References Cited

U.S. PATENT DOCUMENTS

| 3,186,554 | 6/1965 | Mack et al. | 211/41 |
| 3,950,057 | 4/1976 | Calabro | 339/65 |
| 4,019,099 | 4/1977 | Calabro | 361/399 |
| 4,096,547 | 6/1978 | Calabro | 361/388 |
| 4,399,485 | 8/1983 | Wright et al. | 361/384 |

OTHER PUBLICATIONS

EG&G Birtcher brochure, of EG&G Birtcher, 4505 N. Arden Drive, El Monte, CA 91734-1268 U.S.A., undated.
Unitrack Catalog of Unitrack Industries, Inc., Goshen Coprorate Park, 1372 Enterprise Drive, West Chester, PA 19380, Jan. 1988.

Primary Examiner—Roy N. Envall, Jr.
Attorney, Agent, or Firm—Quarles & Brady

[57] ABSTRACT

An electronic circuit module includes a smaller than normal size printed wire board and an adaptor plate to fit the printed wire board into a slot of a rack made for normal size modules. A diverter fixed to the adaptor plate funnels cooling air over the adaptor plate to the printed wire board and a cover contains the air flow next to the adaptor plate and printed wire board. A cover is provided for blocking off empty slots of the rack from air flow and a dummy module is positioned to separate modules from any adjacent empty space so as to assure and adequate supply of cooling air to the electronic circuit components of the modules.

13 Claims, 4 Drawing Sheets

ELECTRONIC CIRCUIT MODULE WITH IMPROVED COOLING

BACKGROUND OF THE INVENTION

1. Field of the Invention

This invention relates to apparatus for cooling electronic circuit modules and particularly to cooling such modules of the type which are mounted in racks.

2. Discussion of the Prior Art

Commercial electronic equipment such as processors and controllers is commonly made by mounting modules which include the printed wire boards (also known as printed circuit boards or circuit cards) that perform the electronic functions of the equipment in frames, known as "racks". The modules are usually mounted side-by-side in the racks vertically or horizontally and are slidable in "slots" defined by edge guides of the rack. Several rows or columns of modules may be provided in a single rack, and several racks may be mounted in a self-contained enclosure. One board, known as a "back plane", at the rear of the rack has connectors mounted on it to electrically mate with corresponding connectors on the modules as they are slid into the rack and makes interconnections between the modules and to controls and I/O interfaces mounted on the exterior of the enclosure.

As is well known, many electronic components generate considerable heat, and will self-destruct unless they are properly cooled. Thus, it is often necessary to provide a certain minimum air flow rate over the components on a printed wire board to insure proper operation of the equipment.

Cooling is usually provided to rack mounted electronic circuit modules by providing fans in the enclosure to force air through the racks in the direction of the boards, i.e. a vertical air flow for vertically mounted boards and a horizontal air flow for horizontal boards. However, cooling problems can arise when less than all the slots in a row, for vertically mounted boards, or less than all the slots in a column, for horizontally mounted boards, are filled. In those cases, the cooling air will flow through the open spaces rather than over the electronic components where there is more resistance to flow.

Another problem with cooling arises when boards of different sizes are used in the same rack. In that case, a board which is too small to fill a slot by itself is mounted in an adaptor plate which, in combination with the board, is sized and shaped to fill the slot. Typical cooling of boards so mounted results in most of the cooling air flowing around the board, i.e. over the surfaces of the adaptor plate, rather than over the components mounted on the board.

SUMMARY OF THE INVENTION

The present invention provides a specially cooled electronic circuit module and apparatus for cooling electronic circuit modules which are mounted in racks. In one aspect of the invention, an electronic circuit module for mounting in a rack is provided. The module includes a printed wire board which is smaller than the normal size of boards for mounting in the rack and has electronic circuit components mounted on it. An adaptor plate is sized and shaped for mounting to the printed wire board to increase the effective size of the printed wire board to the normal size and shape of printed wire boards for mounting in the rack. Duct means are fixed to the adaptor plate to block off, from cooling air flow, portions of the adaptor plate in which the printed wire board is not mounted. Thereby, an adequate flow of air is diverted for cooling of the printed wire board.

In another aspect, a cover for blocking off the air ventilation holes adjacent to empty slots is provided. Blocking off the vents adjacent to empty slots prevents air intended for cooling electronic circuit modules from flowing through the slots thereby insuring an adequate cooling flow through the filled slots.

In another aspect, a dummy module is adjacent to an empty slot blocked off by a cover and a module including a printed wire board which mounts electronic components is adjacent to the dummy module on the side opposite from the empty slot. The dummy module is the size and shape of the adjacent module but does not mount any electronic circuit components thereon. The dummy module is for the purpose of dividing the slot occupied by the adjacent module from the empty slot to block off the flow of cooling air away from the adjacent module to the empty slot, thereby assuring an adequate supply of cooling air over the electronic circuit components of the adjacent module.

It is therefore a principal object of the invention to provide improved cooling for electronic circuit modules, especially for such modules of the type which are mounted in racks.

It is another, more specific object of the invention to provide a cooling system for an electronic circuit module made with a printed wire board which is smaller than normal printed wire boards for the same size module.

It is another object of the invention to provide improved cooling for rack-mounted electronic circuit modules when fewer than all the slots in the rack are occupied by modules.

It is another object of the invention to provide improved cooling for a rack-mounted electronic circuit module which occupies a slot in a rack which is adjacent to an empty slot.

It is another object of the invention to provide such improvements in ways which are economical and easy to manufacture.

These and other objects of the invention will be apparent from the drawings and from the detailed description.

DETAILED DESCRIPTION OF THE PREFERRED EMBODIMENT

Figure 1:
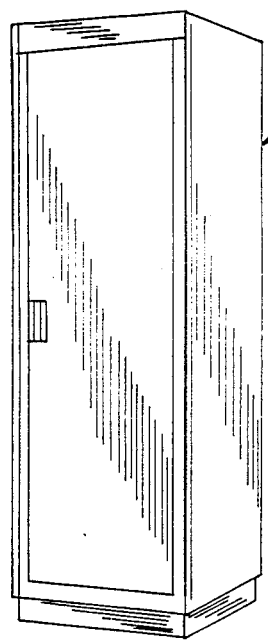
FIG. 1 is a perspective view of the exterior of a typical rack enclosure for electronic circuit modules and racks utilizing aspects of the present invention.

Referring to FIG. 1, an electrical enclosure 10 is shown. Such enclosures are usually made to standard specifications to mount racks 12 (FIG. 2), which are also made to standard specifications. For example, the rack 12 shown is a standard 9U×400 mm rack. The "9U" refers to the height (1U equals approximately 1.75 inches) and the "400 mm" refers to the depth of the modules 14, 15, 16, 17 and 18 which are slidably mounted and occupy "slots" in the rack. As used herein, the term "slot" refers to each space in the rack reserved for any single module and "normal size" refers to the normal dimensions of a module or printed wire board necessary to fit into a slot of a particular rack, e.g., for the rack 12, the normal size is 9U×400 mm.

The enclosure 10 shown is for mounting racks 12 one on top of the other to form vertical columns of racks and therefore of modules. Each rack 12 has several slots, one for each module and thus each rack 12 can mount a horizontal row of modules. It is also possible to mount columns of racks 12 side by side in suitable enclosures, so that two or more racks 12 may define a horizontal row of modules. The rack 12 shown is for mounting modules vertically, however, it should be understood that racks are also made which mount modules horizontally, and the invention applies to such arrangements.

The enclosure 10 is typically provided with a fan or fans or other suitable means for providing an air flow through the racks 12 to cool the electronic circuit components which make up the modules. For vertical modules, the fans are typically placed in either the top or bottom of the enclosure 10 to provide an air flow up through the enclosure. Air ventilation holes 20 are provided in the top and bottom of each rack 12 to allow air flow through the rack 12 and between the modules. If the modules were mounted horizontally, the air flow would normally be from left to right (as viewed in FIG. 4) or vice versa.

Each module 14, 15, 16, 17 and 18 includes a flat planar component which is sized to slide into guide tracks 22 fixed on the top and bottom of the rack 12 to hold the modules vertically. Each module also includes a front plate 30 along the front edge of the planar component which locks the module to the rack 12 in well known fashion and, in cooperation with the front plates 30 of the other modules, closes off the front of the rack 12. Even if slots of the rack 12 are empty, a front plate 30 may still be attached to the rack over the front of the empty slots.

The planar components of the modules 14, 15 and 16 are printed wire boards 23, 24 and 25 which are of a normal size and shape (9U×400 mm for the particular rack 12 shown) to completely fill the slots which they occupy. The boards 23, 24 and 25 mount electronic circuit components 26 (see FIG. 7) which generate heat and have a certain cooling air flow requirement, which must be met by the flow through the enclosure 10. One of the main purposes of this invention is to insure that the cooling requirement is met even if the rack 12 or enclosure 10 is not filled with modules or if smaller than normal size printed wire boards are used in the rack.

The planar component of the module 18 includes an adaptor plate 32 and a printed wire board 33. The printed wire board 33 shown is a 6U×160 mm board and is therefore smaller than the normal size required to fit into the rack 12. Because the board 33 is not large enough to fill a slot by itself, it is necessary to fasten it to the adaptor plate 32 using appropriate connectors 35 (FIG. 4) to allow mounting it in the rack 12. The board 33 is mounted in the plane of the adaptor plate 32 so that the adaptor plate 32/printed wire board 33 assembly in effect resembles and is the same size and shape as the boards 23, 24 and 25. The adaptor plate 32 is sized and shaped to, in combination with the board 33, normalize the size of the module 18. A front plate 30 is also mounted to the front edge of the adaptor plate 32 to complete the module 18.

Figure 2:
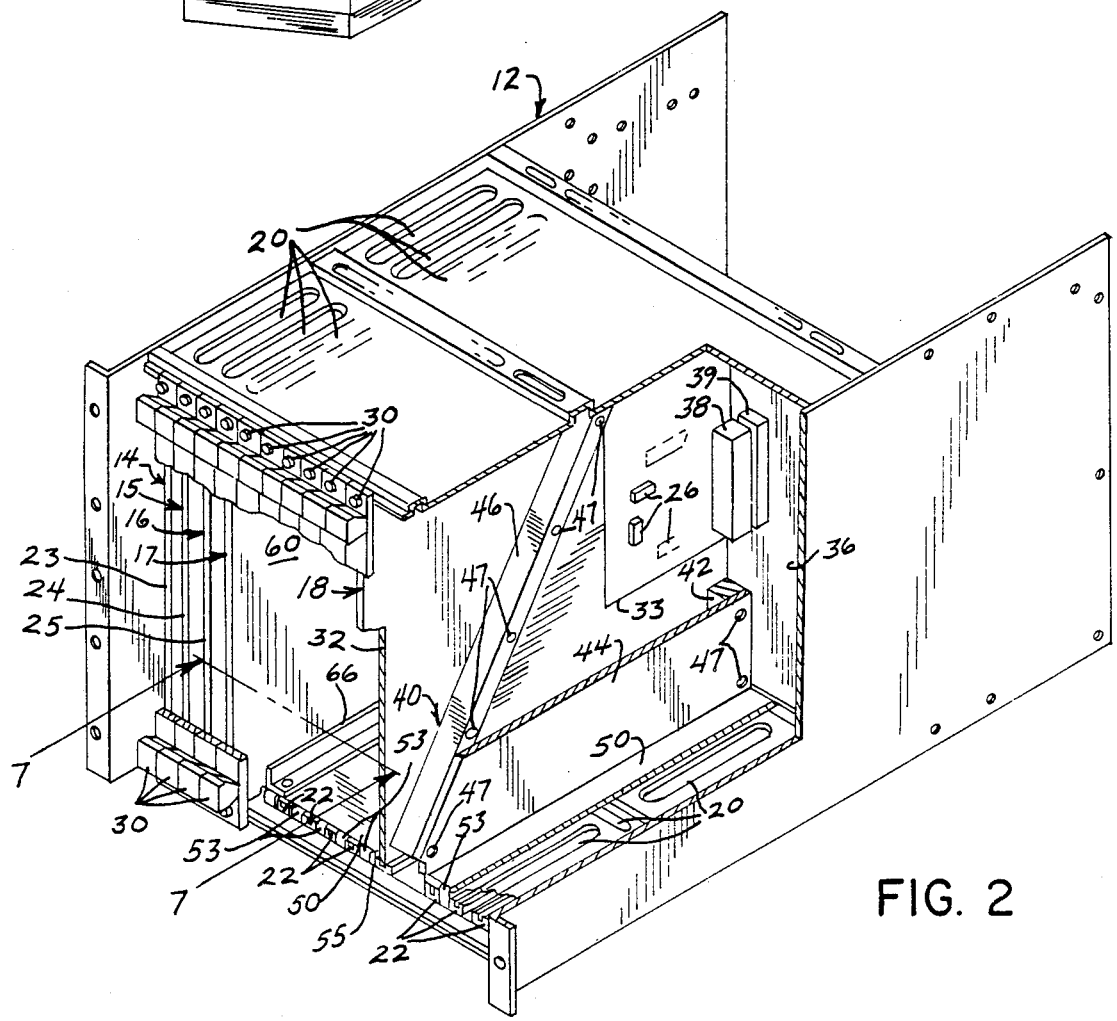
FIG. 2 is a perspective view of a rack removed from the enclosure of FIG. 1 and illustrating different aspects of the invention.

As shown in FIG. 2, a back plane 36 or "mother board" closes off the back of the rack 12 at the rear of the modules. The modules 14, 15, 16 and 18, which all bear electronic circuit components, have plugs such as 38 shown on module 18 which electrically mate with plugs like plug 39 shown on the back plane so that the back plane can interconnect the modules and facilitate connections with input/output devices mounted to the rack or enclosure. It is also possible that a single back plane could be common to more than one or all the racks 12 in the enclosure 10.

Typically, an adaptor plate 32, printed wire board 33 and front plate 30, together with the associated fasteners, made up a complete module of the type in which the printed wire board is smaller than normal size. As cooling air flows over the board, the electronic circuit components 26 (FIGS. 2 and 5) protruding from the printed wire board 33 act as flow restrictions. Since in typical prior modules there are no restrictions on the adaptor plate 32, the cooling air for such modules tends to flow there rather than over the printed wire board 33 where it was most needed to meet the cooling requirements of the electronic circuit components 26.

Figure 3:
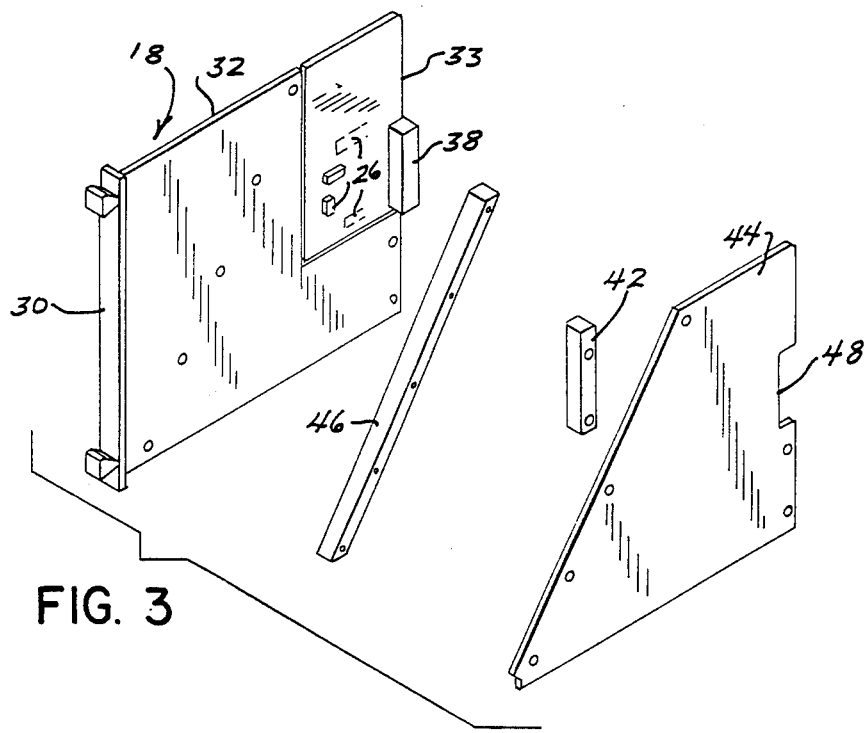
FIG. 3 is an exploded perspective view of an electronic circuit module of the present invention.

To alleviate this problem, the present invention provides a duct 40 to block off from air flow portions of adaptor plate 32 in which the printed wire board 33 is not mounted and divert cooling air to the printed wire board 33. The duct 40 of the preferred embodiment is mounted to the adaptor plate 32 and includes a spacer bar 42, a cover 44 and a diverter 46 (FIGS. 2-4), all attached to the adaptor plate 32 and to one another with appropriate fasteners 47. The cover 44 has a cutout 48 to accommodate the plug 38, which because of its size, shape and location, acts as an extension of the spacer bar 42 to contain the air flow inside the duct 40. It should also be noted that the back plane 36 closes off the back of the duct 40 in the area downstream of the plug 38 and that in some applications the back plane alone (without the spacer 42 or plug 38) may be sufficient to close off the back of the duct 40.

Figure 4:
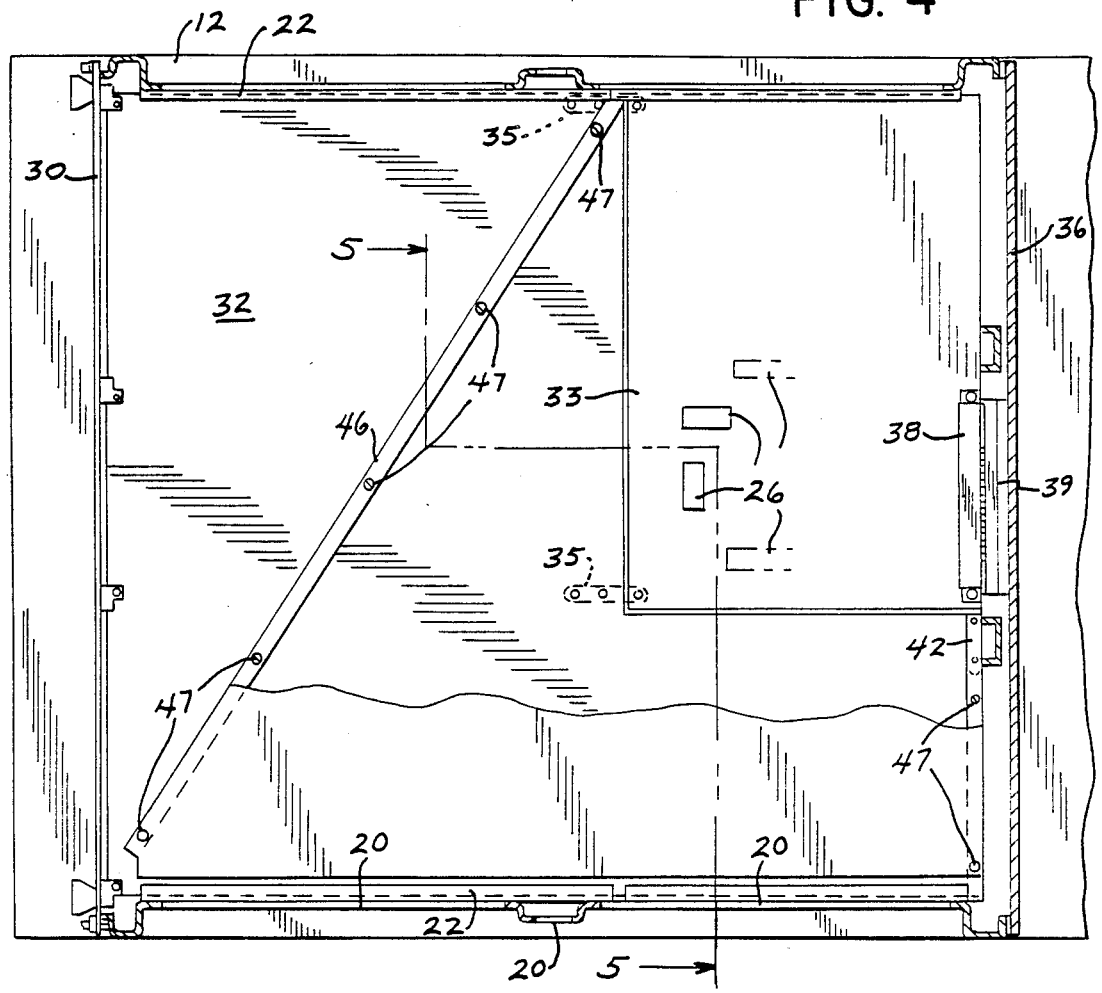
FIG. 4 is a side view in section of the module of FIG. 3 mounted in a rack and with a portion broken away.

For the rack shown in FIG. 2, the air flow direction is upwardly so that the duct 40 funnels the air flow to a decreasing width toward the printed wire board 33 in the flow direction. The duct 40 traverses substantially the entire dimension of the adaptor plate 32 to the downstream end of the board 33 in the flow direction and tapers in width for the entire dimension. In the preferred embodiment illustrated, the diverter 46, which defines the left side of the duct as viewed in FIG. 4, is straight, and extends from approximately the furthest upstream left or far corner of the adaptor plate 32 to the furthest downstream near or inside corner of the printed wire board 33. Thus, the cooling air which would otherwise flow over areas of the adaptor plate 32 which are barren of electronic circuit components 26 is directed toward the printed wire board 33.

Other shapes for the duct 40 are also possible which would yield acceptable results in some applications. For example, one shape which was experimented with was having the diverter and left side of the duct have one leg extending angularly from approximately the upstream left corner of the adaptor plate 32 to the upstream near corner of the printed wire board 33, and a second leg extending straight in the flow direction to the downstream near corner of the printed wire board. This was found to create a vortex in which the cooling capacity was reduced over the printed wire board adjacent to the second leg of the diverter. Other shapes were also tried in which the first leg of the diverter was extended to locations between the upstream and downstream near corners of the printed wire board 33, with the second leg extending the remaining distance to the downstream near corner of the printed wire board 33. In each case, some vortex was created over the printed wire board 33. However, these ducts could still be useful in some applications. Moreover, in some applications a printed wire board may be mounted in other corners of an adaptor plate or in an interior area of an adaptor plate. In these cases, the duct shape may vary from that shown, e.g., for a printed wire board mounted in the interior of an adaptor plate, both sides of the duct may angle from the upstream corners of the adaptor plate to the board.

It should also be noted that the diverter 46 or a similar device may be all that is required in some applications to form an adequate duct for directing the cooling air from the barren areas of the adapter plate to the printed wire board. For example, if another module is immediately adjacent to a module like module 18 (on the side of the electronic circuit components 26), then the diverter 46 alone, without the cover 44 or spacer bar 42, would redirect most of the cooling air to the printed wire board. There would be some leakage through the gap between the diverter and the adjacent module, but the gap could in some applications be made sufficiently small so that the amount of air diverted would be adequate to meet the cooling needs of the printed wire board. Moreover, a variation which should be apparent is that the diverter 46, cover 44 and spacer bar 42 could be made as a single unit.

Figure 5:
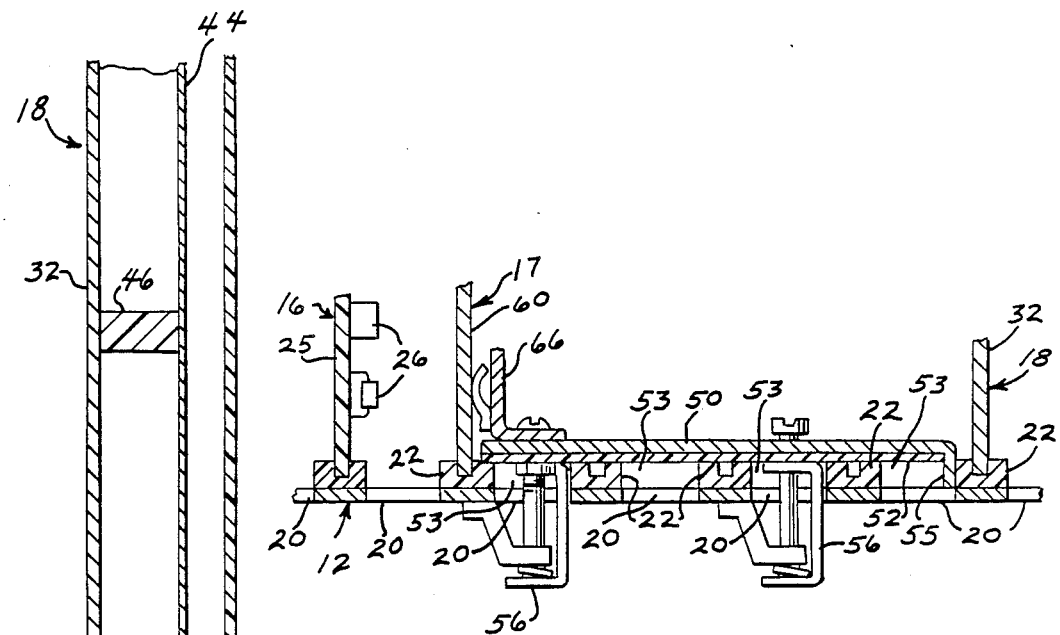
FIG. 5 is a sectional view taken along the plane of the line 5—5 of FIG. 4 and illustrating another module adjacent to the module of FIGS. 3 and 4.

Referring to FIG. 5, the relative spacings between the planar components of an adaptor plate 32/printed wire board 33, a cover 44 and an adjacent module 70 are shown. Electronic circuit components 26 are mounted on the right sides of the adaptor plate 32/printed wire board 33 and the module 70 as represented in FIG. 5. The distance D from guide track 22 to guide track 22 is typically 0.8 inches. The thicknesses of the adaptor plate 32/printed wire board 33 and printed wire board of the module 70 are each approximately 0.06 inches and the thickness of the cover 44, which may be made of fiberglass, is 0.03 inches. The height of the diverter 46 is approximately 0.58 inches so that the cover 44 is spaced that distance from the adaptor plate 32/printed wire board 33. The cover 44 is laterally spaced 0.03 from the near edge of the guide track 22 for the module 70 and 0.13 away from the solder side 71 of the module 70. The cover 44 also terminates approximately 0.1 inches above the guide track 22 for the module 70 to allow a sufficient flow of air over the solder side 71 of the module 70 for proper cooling thereof.

Figure 6:
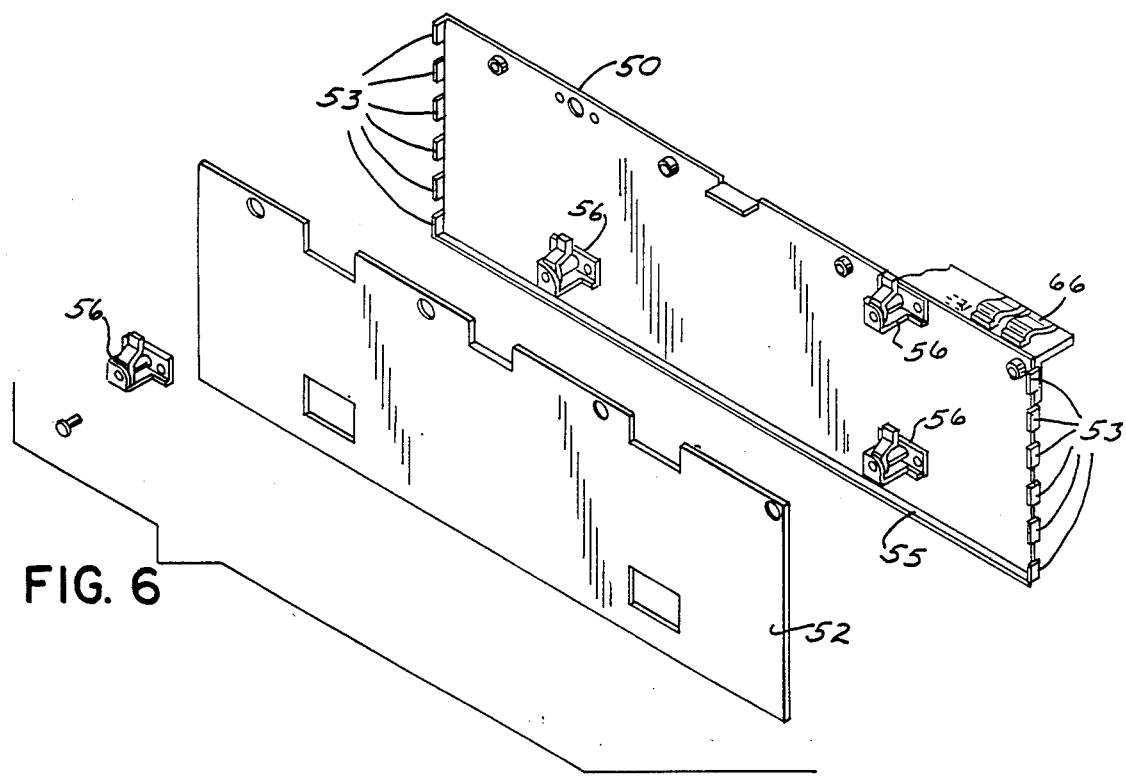
FIG. 6 is an exploded bottom perspective view of a cover and gasket for a rack.
Figure 8:
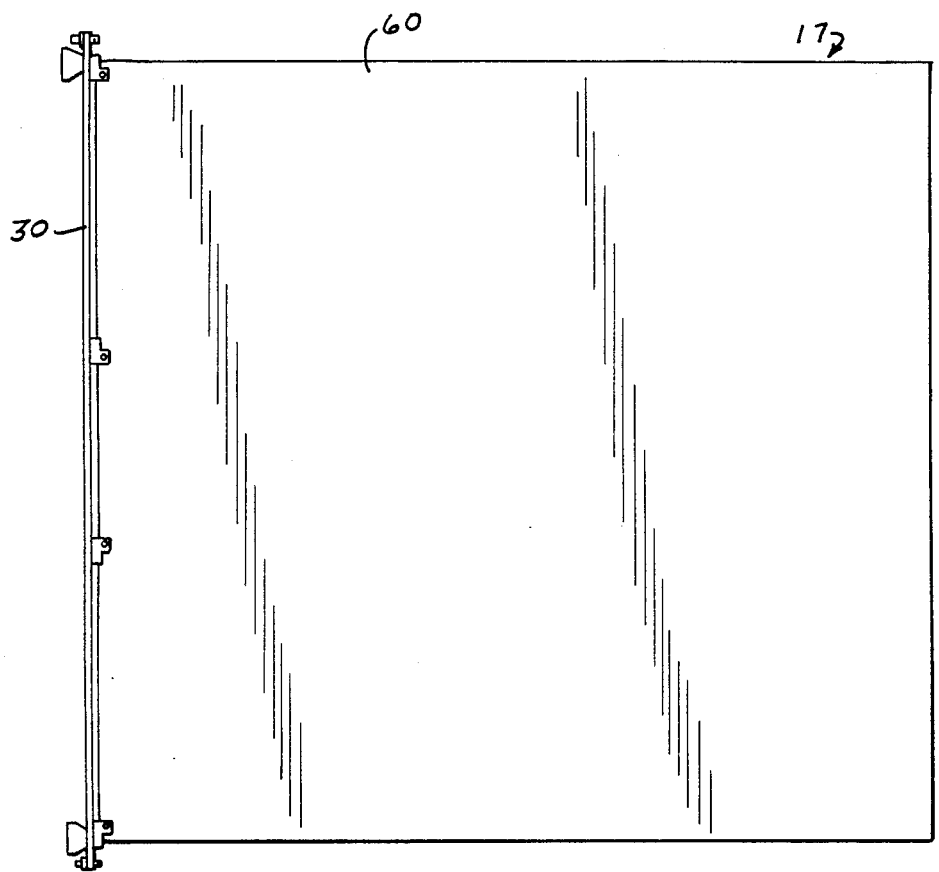
FIG. 8 is a side elevation view of a dummy board for the rack.

Referring to FIG. 2, oftentimes fewer than all the slots of a rack are actually used. When this occurs, the modules which do occupy the rack provide resistance to the flow of cooling air and the air tends to flow through the empty slots, rather than over the electronic circuit components of the present modules where it is most needed. To redirect the cooling air to the occupied slots, one or more covers 50 (FIGS. 2, 6 and 7) are attached to the rack 12 over the upstream air ventilation holes 20 which border unoccupied slots. Each cover 50 is provided with a gasket 52 to seal against the guide tracks 22. Ears 53 of the cover 50 fit between the guide tracks 22 (FIG. 2) and a flange 55 along the right side (as viewed in FIGS. 2 and 7) of the cover 50 abuts the side of a guide track 22 (FIG. 7) to restrict air from escaping past the ends and the right side of the cover 50. The left side of the cover rests on top of a guide track 22 so that the gasket 52 seals that side. Push and turn locking mechanisms 56 or other suitable means are provided to secure the cover 50 to the rack 12.

Figure 7:
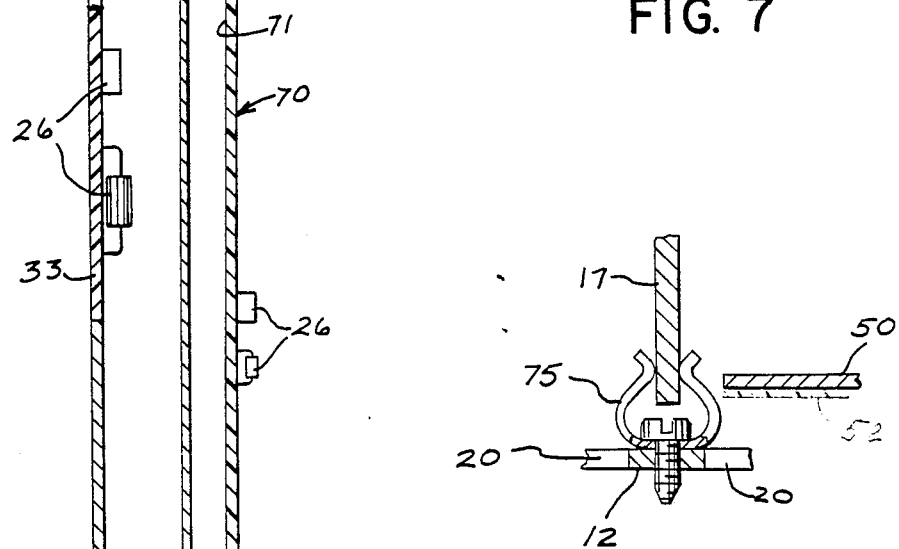
FIG. 7 is a sectional view taken along the plane of the line 7—7 of FIG. 2.

When one or more slots of a rack 12 are left empty, a cooling problem arises which is unique to the module immediately adjacent to the empty slot or slots which has electronic circuit components facing or on the side of the empty slot or slots (hereinafter referred to as the end module). The module 16 is such an end module and is best shown in FIGS. 2 and 7. If the end module is of the type having a duct 40 including a cover as discussed above, then there is no problem. However, if the module is of the usual type like the module 16 in which no duct of any sort is used, then the air ventilation holes 20 immediately adjacent to the printed wire board 25 on the side of the electronic circuit components 26 must be left open. Even if the other air ventilation holes 20 adjacent to empty slots are covered as discussed above, cooling air intended for the end module 16 will enter the rack 12 through the air ventilation holes 20 adjacent to the module 16 but flow through the empty slots rather than cool the electronic components 26 of the end module 16.

A module 17, hereinafter referred to as a dummy module, is therefore provided in the slot immediately adjacent to the end module 16 on the circuit component side of such module. The planar component of the dummy module 17 is a plain flat sheet 60 of a normal size and shape to fill a slot of the rack 12. A front plate 30 is mounted on the sheet 60 to complete the dummy module 17. The dummy module 17 divides the slot which the end module 16 occupies from the empty slot on the other side of the dummy module 17 and keeps the cooling air which flows through the air ventilation slots 20 adjacent to the end module 16 flowing next to the end module 16 to cool the circuit components mounted thereon. Note that even if the slot on the side of the dummy module 17 opposite from the end module 16 was filled with another module, the dummy module 17 would still be useful for its purpose.

The dummy module 17 is preferably made of metal so that it may shield electrical components in the rack from radio frequency interference. To do so and to dissipate any charge, the dummy module 17 should be grounded. The guide tracks 22 are typically made of an insulator such as plastic so no ground path is provided by them between the dummy module 17 and the rack 12, which is grounded. Rather, suitable spring contacts 66 (FIGS. 6 and 7) provide a circuit from the dummy module 17 to the cover 50 (which is also metal) which is in electrical contact with the rack (e.g., via the push and turn locking mechanisms 56, which are metal).

Figure 9:
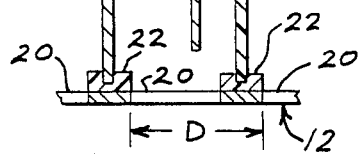
FIG. 9 is a sectional view of an alternate embodiment for grounding the dummy board of FIG. 8.

An alternate embodiment for grounding the dummy module 17 is illustrated in FIG. 9. In this embodiment, the dummy module 17 is grounded to rack 12 through one or more metal card guides 75 which are screwed to the rack 12. The card guides 75 may have resilient sides 76 to pinch the dummy module 17 between them and therefore assure contact. The card guides 75 may also be the sole means of guiding the dummy module 17, or may be disposed between ordinary guides 22, which would perform the main guiding function.

Many modifications and variations of the preferred embodiment will be apparent to those of ordinary skill in the art but will still be within the spirit and scope of the invention. Therefore, the invention should not be limited by the scope of the preferred embodiment, but only by the claims which follow.

We claim:

1. A module for mounting in a rack for holding such modules of a certain normal size and which include printed wire boards, comprising:
   a printed wire board smaller than the normal size of modules for mounting in the rack and having electronic circuit components mounted on it;
   an adaptor plate sized and shaped for mounting to the printed wire board to increase the effective size of the printed wire board to the normal size of modules for mounting in the rack;
   means mounting the adaptor plate to the printed wire board; and
   duct means fixed to the adaptor plate for blocking off from cooling air flow portions of the adaptor plate in which the printed wire board is not mounted and diverting the blocked off cooling air flow to the printed wire board.

2. A module as in claim 1, wherein the air flow through the rack defines a flow direction and the duct means funnels the air flow to a decreasing width toward the printed wire board in the flow direction.

3. A module as in claim 2, wherein the duct means traverses substantially the entire dimension of the module in the flow direction and the diverted air flow tapers in width for said entire dimension.

4. A module as in claim 2, wherein the printed wire board is mounted to the adaptor plate so that it defines a corner of the module and the duct means includes a cover, a diverter at one side of the cover, and a spacer at the other side of the cover, the diverter extending from approximately the corner of the module which is diagonal from the printed wire board to the furthest downstream near corner of the printed wire board.

5. A module as in claim 1, wherein the module is for vertical mounting with an entrance end of the duct means at a vertical end of the module and an exit end of the duct means at the opposite vertical end of the printed wire board.

6. A module as in claim 2, wherein the duct means redirects the cooling air flow past the module such that it is substantially the full width of the module at its upstream end and tapers in width in the flow direction to the printed wire board.

7. A module as in claim 6, wherein the duct means redirects the cooling air flow past the module such that the flow tapers continuously in width in the flow direction to the furthest downstream end of the printed wire board.

8. In a rack having slots for holding electronic circuit modules and which permits an air flow through it for cooling the modules, the improvement comprising a cover blocking the air flow through at least one empty slot of the rack in which no module is positioned to divert the flow of cooling air away from said empty slot and redirect it through one or more filled slots in which modules are disposed.

9. The improvement of claim 8, wherein the rack has guide tracks over which the cover lies and the cover has ears which fit between the guide tracks to block off the flow of cooling air.

10. The improvement of claim 8, wherein a dummy module is adjacent to the empty slot blocked off by the cover and a module including a printed wire board which mounts electronic components is adjacent to the dummy module on the side opposite from the empty slot, said dummy module being the size and shape of said adjacent module and mounting no electronic circuit components thereon, said dummy module being for the purpose of dividing the slot occupied by the adjacent module from the empty slot to block off the flow of cooling air away from the adjacent module to the empty slot.

11. The improvement of claim 10, wherein the dummy module is made of electrically conductive materials and is electrically grounded.

12. The improvement of claim 11, wherein the rack and cover are also made of electrically conductive materials and are electrically connected to one another, and further comprising an electrical contact mounted to the cover along an edge of the cover adjacent to the dummy module to make an electrical connection between the cover and the dummy module.

13. In a rack having slots for holding electronic circuit modules and which permits an air flow through it for cooling the modules, the improvement wherein a first module includes: (a) an adaptor plate, (b) a printed wire board fixed to the adaptor plate and having electronic circuit components mounted on it; and (c) duct means fixed to the adaptor plate for blocking off portions of the adaptor plate in which the printed wire board is not mounted and diverting cooling air to the printed wire board; and wherein a second module is mounted in the rack adjacent to the cover of the first module and a gap exists between the cover and the second module to form a flow path for cooling air to a side of the second module which is adjacent to the cover.

* * * * *

UNITED STATES PATENT AND TRADEMARK OFFICE
CERTIFICATE OF CORRECTION

PATENT NO. : 4,935,845

DATED : Jun. 19, 1990

INVENTOR(S) : Schwehr et al.

It is certified that error appears in the above-identified patent and that said Letters Patent is hereby corrected as shown below:

In Col. 8, lines 9-32 cancel claims 8-10 and substitute therefor the following claims 9 and 10.

9. In a rack having slots for holding electronic circuit modules and which permits an air flow through it for cooling the modules, the improvement comprising a cover blocking the air flow through at least one empty slot of the rack in which no module is positioned to divert the flow of cooling air away from said empty slot and redirect it through one or more filled slots in which modules are disposed, wherein a dummy module is adjacent to the empty slot blocked off by the cover and a module including a printed wire board which mounts electronic components is adjacent to the dummy module on the side opposite from the empty slot, said dummy module being the size and shape of said adjacent module and mounting no electronic circuit components thereon, said dummy module being for the purpose of dividing the slot occupied by the adjacent module from the empty slot to block off the flow of cooling air away from the adjacent module to the empty slot.

UNITED STATES PATENT AND TRADEMARK OFFICE
CERTIFICATE OF CORRECTION

PATENT NO. : 4,935,845

DATED : Jun. 19, 1990

INVENTOR(S) : Schwehr et al.

It is certified that error appears in the above-identified patent and that said Letters Patent is hereby corrected as shown below:

10. The improvement of claim 9, wherein the rack has guide tracks over which the cover lies and the cover has ears which fit between the guide tracks to block off the flow of cooling air.

Title page: "13 claims, 4 Drawing Sheets" should read --12 claims, 4 Drawing Sheets--.

Signed and Sealed this

Tenth Day of September, 1991

Attest:

HARRY F. MANBECK, JR.

*Attesting Officer*     *Commissioner of Patents and Trademarks*